US011844174B2

(12) United States Patent
Fujino et al.

(10) Patent No.: US 11,844,174 B2
(45) Date of Patent: Dec. 12, 2023

(54) ELECTRONIC SUBSTRATE

(71) Applicant: Panasonic Intellectual Property Management Co., Ltd., Osaka (JP)

(72) Inventors: Shinkuro Fujino, Kyoto (JP); Tomokazu Deki, Kanagawa (JP); Hiroyuki Tahara, Kanagawa (JP); Takao Takeshita, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 86 days.

(21) Appl. No.: 17/633,715

(22) PCT Filed: Jul. 21, 2020

(86) PCT No.: PCT/JP2020/028282
§ 371 (c)(1),
(2) Date: Feb. 8, 2022

(87) PCT Pub. No.: WO2021/029194
PCT Pub. Date: Feb. 18, 2021

(65) Prior Publication Data
US 2022/0322521 A1 Oct. 6, 2022

(30) Foreign Application Priority Data

Aug. 9, 2019 (JP) ................................. 2019-147349

(51) Int. Cl.
*H05K 1/02* (2006.01)
*H05K 1/18* (2006.01)
*H04N 23/52* (2023.01)

(52) U.S. Cl.
CPC ........... *H05K 1/0225* (2013.01); *H04N 23/52* (2023.01); *H05K 1/182* (2013.01);
(Continued)

(58) Field of Classification Search
CPC ................ H05K 1/0225; H05K 1/182; H05K 2201/0969; H05K 2201/10121; H05K 2201/10356
See application file for complete search history.

(56) References Cited

U.S. PATENT DOCUMENTS 9,923,309 B1 * 3/2018 Aizawa ................. H05K 1/113
2011/0163919 A1   7/2011 Suzuki
(Continued)

FOREIGN PATENT DOCUMENTS

JP   2013-165273     8/2013
JP   2019-075715     5/2019
KR   10-2013-0105151 A   9/2013

OTHER PUBLICATIONS

The EPC Office Action from the European Patent Office (EPO) dated Mar. 28, 2023 for the related European Patent Application No. 20851561.9.
(Continued)

*Primary Examiner* — Hoa C Nguyen
(74) *Attorney, Agent, or Firm* — Greenblum & Bernstein, P.L.C.

(57) ABSTRACT

An electronic board includes: a board including an upper surface ground on an upper surface; at least one first land formed on the upper surface and connected to a first signal line; at least one second land formed on the upper surface and connected to a second signal line; at least one third land disposed on the upper surface between the first land and the second land and connected to the upper surface ground; and at least one fourth land disposed on the upper surface on a side opposite to the third land and connected to the upper surface ground, the first land being interposed between the third land and the fourth land.

8 Claims, 7 Drawing Sheets

(52) U.S. Cl.
CPC ............... *H05K 2201/0969* (2013.01); *H05K 2201/10121* (2013.01); *H05K 2201/10356* (2013.01)

(56) References Cited

U.S. PATENT DOCUMENTS

| | | | |
|---|---|---|---|
| 2011/0175793 A1 | 7/2011 | Suzuki | |
| 2011/0212649 A1 | 9/2011 | Stokoe et al. | |
| 2013/0175077 A1* | 7/2013 | Kim | H05K 1/114 |
| | | | 174/262 |
| 2015/0257254 A1 | 9/2015 | Suzuki | |
| 2015/0289362 A1* | 10/2015 | Tanaka | H01R 13/6473 |
| | | | 174/262 |
| 2017/0187419 A1* | 6/2017 | Zhang | H04B 3/32 |
| 2017/0196079 A1* | 7/2017 | Morgan | H05K 1/115 |
| 2018/0263109 A1 | 9/2018 | Chen et al. | |
| 2018/0331043 A1* | 11/2018 | Zhang | H01L 24/00 |
| 2020/0163258 A1 | 5/2020 | Hatano et al. | |

OTHER PUBLICATIONS

The Extended European Search Report from the European Patent Office (EPO) dated Aug. 2, 2022 for the related European Patent Application No. 20851561.9.

International Search Report (ISR) from International Searching Authority (Japan Patent Office) in International Pat. Appl. No. PCT/JP2020/028282, dated Oct. 20, 2020, together with an English language translation.

* cited by examiner

ELECTRONIC SUBSTRATE

TECHNICAL FIELD

The present invention relates to an electronic board.

BACKGROUND ART

PTL 1 discloses a camera including a circuit board that converts light passing through a lens into an electric signal, a connector that includes an outer conductor and connects the circuit board and an external cable, a shielding conductor that is disposed outside the circuit board, and an insulation housing in which the circuit board and the shielding conductor are accommodated. In the camera, the connector includes an inner connector provided on the circuit board, an intermediate connector connected to the inner connector and connected to the shielding conductor, and an outer connector for connecting an external cable to the intermediate connector, and the shielding conductor is supported by an outer conductor of the intermediate connector. Further, a support structure of the shielding conductor by the outer conductor has rotational symmetry with respect to the entire circumference of the outer conductor, the shielding conductor has a shape of surrounding the circuit board starting from a boundary portion between the outer conductor of the intermediate connector and the shielding conductor, and the insulation housing is connected to the intermediate connector and is supported by the intermediate connector.

CITATION LIST

Patent Literature

PTL 1: Japanese Patent Unexamined Publication No. 2019-75715

SUMMARY OF THE INVENTION

The present disclosure has been made in view of the above-described situation in the related art, and an object of the present disclosure is to provide an electronic board capable of suppressing an influence of noise.

According to the present disclosure, there is provided an electronic board including: a board including an upper surface ground on an upper surface; at least one first land formed on the upper surface and connected to a first signal line; at least one second land formed on the upper surface and connected to a second signal line; at least one third land disposed on the upper surface between the at least one first land and the at least one second land and connected to the upper surface ground; and at least one fourth land disposed on the upper surface on a side opposite to the at least one third land and connected to the upper surface ground, the at least one first land being interposed between the at least one third land and the at least one fourth land.

According to the present disclosure, an influence of noise can be suppressed.

DESCRIPTION OF EMBODIMENT

Background to Contents of Exemplary Embodiment 1

PTL 1 discloses a camera in which a shielding conductor has a shape of surrounding a circuit board and a support structure of the shielding conductor by an outer conductor of an intermediate connector has a rotational symmetry with respect to an entire circumference of the outer conductor. As a result, in the camera in the related art, a potential can be stabilized, and electromagnetic waves which are radiated from peripheral devices and are directed to the circuit board can be effectively shielded. Thus, the camera in the related art can have a noise resistance performance. In addition, the camera in the related art can effectively shield the electromagnetic waves which are radiated from the circuit board and are directed to the peripheral devices. However, in a structure of the circuit board of the camera in the related art, in a case where a plurality of cables connected between the circuit board and each of different systems are connected to be close to each other, an interference occurs between the cables, and as a result, an influence of noise may not be suppressed.

In the following exemplary embodiment 1, an example of an electronic board capable of suppressing an influence of noise in a case where a plurality of cables are used will be described.

Hereinafter, an exemplary embodiment in which a configuration and an operation of a board of a camera according to the present disclosure are specifically disclosed will be described in detail with reference to drawings as appropriate. Here, more detailed explanation than necessary may be omitted. For example, a detailed explanation of an already well-known matter and a repeated explanation for substantially the same configuration may be omitted. This is to avoid unnecessary redundancy of the following description and to facilitate understanding of those skilled in the related art. The accompanying drawings and the following description are provided for those skilled in the related art to fully understand the present disclosure, and are not intended to limit the subject matter described in the claims.

Figure 1:
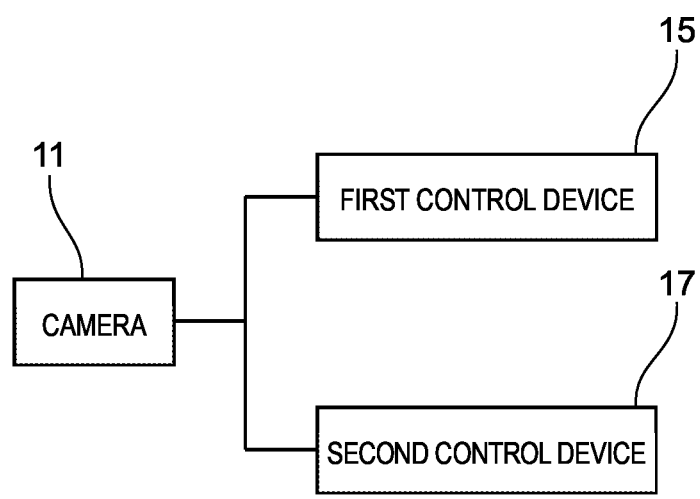
FIG. 1 is a diagram illustrating a configuration example of a system in which a camera including an electronic board according to an exemplary embodiment 1 is used.
Figure 2:
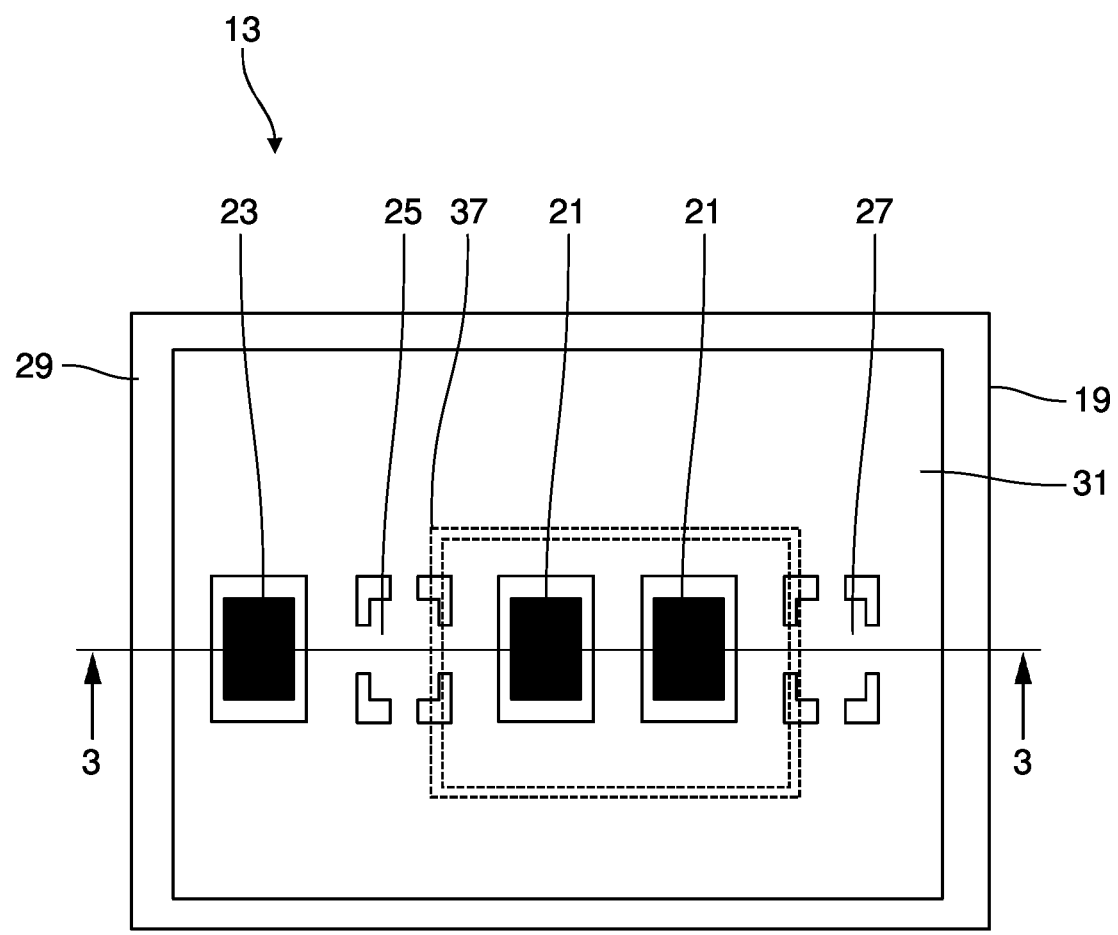
FIG. 2 is a plan view of an example of the electronic board according to the exemplary embodiment 1.

FIG. 1 is a diagram illustrating a configuration example of a system in which camera 11 including electronic board 13 according to an exemplary embodiment 1 is used. FIG. 2 is a plan view of electronic board 13. In the exemplary embodiment 1, camera 11 is, for example, an in-vehicle camera. Further, electronic board 13 according to the exemplary embodiment 1 is described as an electronic board included in camera 11. On the other hand, it goes without saying that application of electronic board 13 is not limited to a camera. Further, electronic board 13 may not be a board included in camera 11. For example, electronic board 13 may be a board included in a converter for separating a video, an audio, a control signal, and the like.

Camera 11 includes at least a lens (not illustrated) and an image sensor (not illustrated). The image sensor is, for example, a solid-state image sensor such as a charged-coupled device (CCD) or a complementary metal oxide semiconductor (CMOS), and converts an optical image formed on an imaging surface into an electric signal. Camera 11 is used, for example, as one of sensing techniques for realizing autonomous driving of a vehicle, and is communicably connected to first control device 15 and second control device 17. Camera 11 transmits, to first control device 15, a video signal including a captured image obtained by capturing. Further, camera 11 generates a control signal, and transmits the generated control signal to second control device 17. For example, the video signal is a signal having a frequency of several MHz or higher (high-speed signal), the control signal is a signal having a frequency of several hundred kHz or lower (low-speed signal), and the video signal is a signal having a speed higher than a speed of the control signal.

A transmission method of the video signal including the captured image obtained by camera 11 may be an analog video signal output method, or may be a high-speed serial digital signal output method capable of stably outputting high-definition image information.

First control device 15 receives the video signal including the captured image which is captured by camera 11, and outputs and controls the video signal. First control device 15 is, for example, an in-vehicle navigation system.

Second control device 17 executes a control based on the control signal received from camera 11. Second control device 17 is, for example, a central control device for a vehicle.

Electronic board 13 (refer to FIG. 2) according to the exemplary embodiment 1 is included in in-vehicle camera 11, transmits the video signal to first control device 15, and transmits the control signal to second control device 17.

Electronic board 13 includes board 19, first land 21, second land 23, third land 25, and fourth land 27.

Electronic board 13 is integrally connected to camera 11. Electronic board 13 receives an electric signal converted from an image sensor that is provided, for example, on a side opposite to a camera lens (not illustrated) (that is, a back surface of camera 11).

The image sensor (not illustrated) is provided with a plurality of terminal portions (not illustrated) such as bumps on a side opposite to an imaging surface. Electronic board 13 is provided with a plurality of terminal portions for connecting camera 11 and a plurality of cables (not illustrated). Further, each of the plurality of terminal portions is connected to each of the plurality of cables by using solder or the like.

Electronic board 13 is a multi-layered board. Electronic board 13 is not limited to a multi-layered board, and may be any of a single-sided board, a double-sided board, a build-up board, a rigid board, and a flexible board.

On upper surface 29 of board 19 of electronic board 13, each of a plurality of first lands 21, second land 23, third land 25, and fourth land 27 are formed. In the exemplary embodiment 1, a surface on which each of the plurality of lands is formed and which is on a side opposite to a lens (not illustrated) of camera 11 is referred to as upper surface 29 of board 19.

On upper surface 29 of board 19, ground 31 is formed. Each of the plurality of lands formed on upper surface 29 of board 19 is connected to a terminal portion such as an image sensor (not illustrated) by a through hole, a via hole, or a printed circuit pattern. In a case where board 19 is, for example, a rigid board, a glass epoxy board may be used. On the other hand, board 19 is not limited thereto.

Further, board 19 is formed in a rectangular shape. On the other hand, a shape of board 19 is not limited thereto. For example, the shape of board 19 may be a shape obtained by forming four corners of a rectangular shape in a round shape.

Ground 31 is formed of a copper foil that covers upper surface 29 in a shape which is substantially similar to the shape of board 19 and is smaller than the shape of board 19. For example, ground 31 may be provided in a linear shape along the shape of each of the plurality of lands.

Each of the plurality of first lands 21 is formed on upper surface 29 of board 19. Each of the plurality of first lands 21 is disposed side by side in a direction along a long side of board 19, and is formed so as to be insulated from ground 31. For example, first land 21 is formed in a rectangular shape having a long side in a direction along a short side of board 19. The shape of each of the plurality of first lands 21 is not limited thereto. Further, the number of the plurality of first lands 21 is not limited to the number illustrated in FIG. 2, and may be one or three or more.

Second land 23 is formed on upper surface 29 of board 19. Second land 23 is disposed side by side with first land 21, which is disposed on a left side in a direction along the long side of board 19, among the plurality of first lands 21, and is formed so as to be insulated from ground 31. Second land 23 is formed in a rectangular shape having a long side in a direction along the short side of board 19. The shape of second land 23 is not limited thereto. Further, the number of second lands 23 is not limited to the number illustrated in FIG. 2, and a plurality of second lands 23 may be provided.

Third land 25 is formed on upper surface 29 of board 19. Third land 25 is disposed between each of the plurality of first lands 21 and second land 23, and is formed to be connected to ground 31. Third land 25 according to the exemplary embodiment 1 is formed in a substantially cross shape in which four corners formed in a rectangular shape are cut out in an L shape and midpoint portions of four sides are connected to ground 31. Thereby, in a case of bonding a wiring conductor using solder or the like, third land 25 can suppress heat diffusion due to heat conduction, and thus soldering can be easily performed.

Fourth land 27 is formed on upper surface 29 of board 19. Fourth land 27 is disposed on a side opposite to third land 25 with the plurality of first lands 21 interposed between fourth land 27 and third land 25, and is formed to be connected to ground 31. Similar to third land 25, fourth land 27 is formed in a substantially cross shape in which four corners formed in a rectangular shape are cut out in an L shape and midpoint portions of four sides are connected to ground 31. Thereby, in a case of bonding a wiring conductor using solder or the like, fourth land 27 can suppress heat diffusion due to heat conduction, and thus soldering can be easily performed.

On upper surface 29 of board 19 of electronic board 13, each of the plurality of first lands 21, second land 23, third land 25, and fourth land 27 are disposed side by side in a row. In the plurality of lands, from one end side of board 19 illustrated in FIG. 2 (left end side in FIG. 2) to the other end side (right end side in FIG. 2), second land 23, third land 25, each of the plurality of first lands 21, and fourth land 27 are disposed side by side in this order. Each of the plurality of first lands 21 is provided adjacent to each other for a differential operation. Therefore, in electronic board 13, five lands including second land 23, third land 25, each of the plurality of first lands 21, and fourth land 27 are disposed and arranged along the long side of board 19. The number of the lands and an area of each land are not limited to the example illustrated in FIG. 2.

Further, in order to obtain an effect of reducing an influence of noise, preferably, electronic board 13 according to the exemplary embodiment 1 has a configuration in which the number of third lands 25 and the number of fourth lands 27 are the same and in which third land 25 and fourth land 27 are disposed so as to be symmetrical with each other. On the other hand, the configuration of electronic board 13 is not limited thereto. For example, the number and the area of third land 25 may be different from the number and the area of fourth land 27. Specifically, the area of third land 25 may be smaller or larger than the area of fourth land 27. Further, third land 25 and fourth land 27 may be a plurality of lands. Specifically, two third lands 25 may be formed, and one fourth land 27 may be formed. In such a case, third land 25 and fourth land 27 are disposed side by side in a direction intersecting with (preferably, orthogonal to) a line passing through one third land 25 and one fourth land 27 (that is, a 3-3 cross-sectional line in FIG. 2). In other words, in a case where a plurality of third lands 25 and fourth lands 27 are provided, third lands 25 and fourth lands 27 are disposed side by side in a direction along the short side of board 19.

Figure 6:
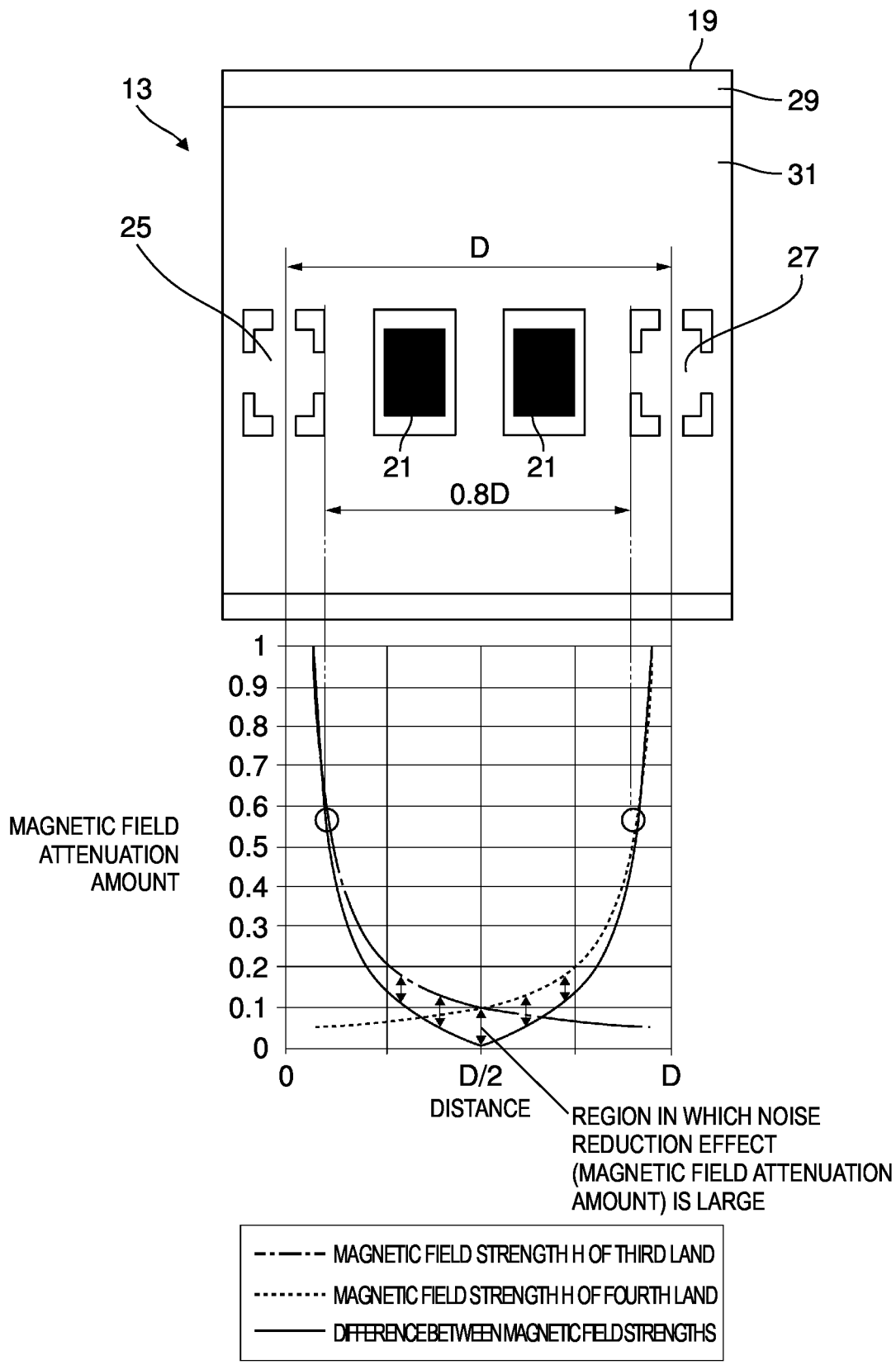
FIG. 6 is an operation explanatory diagram illustrating an example of a correlation between a magnetic field attenuation amount due to each of two magnetic field loops and a distance.

In electronic board 13, first land 21 is disposed within a region of 80% of a distance between centers of third land 25 and fourth land 27 (refer to FIG. 6). Further, electronic board 13 is formed such that the area of third land 25 is equal to or smaller than the area of fourth land 27.

Figure 3:
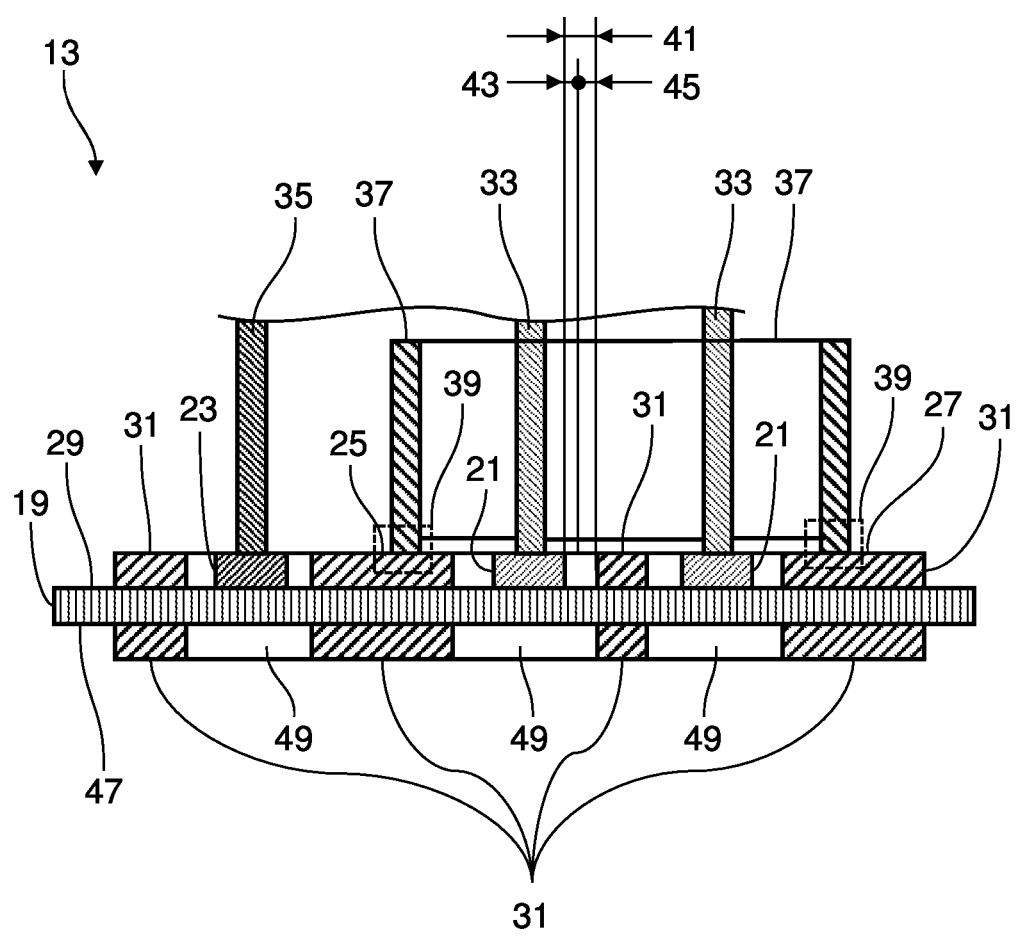
FIG. 3 is a schematic view illustrating a 3-3 cross section in FIG. 2.

FIG. 3 is a schematic view illustrating a 3-3 cross section in an example of electronic board 13 illustrated in FIG. 2.

In electronic board 13, first signal line 33 is connected to each of the plurality of first lands 21. Each of the plurality of first lands 21 and each of a plurality of first signal lines 33 are connected to each other by, for example, soldering. Second signal line 35 is connected to second land 23. Second land 23 and second signal line 35 are connected to each other by, for example, soldering. Third land 25 and fourth land 27 are connected to same shielding conductor 37. Shielding conductor 37 is made of a box-shaped conductor in which at least a bottom is opened.

Shielding conductor 37 according to the exemplary embodiment 1 is formed in a cylindrical shape so as to cover the plurality of first lands 21 and the plurality of first signal lines 33. At a position on the 3-3 cross section in FIG. 2, shielding conductor 37 is connected between third land 25 and fourth land 27 by solder or the like. That is, shielding conductor 37 is connected to ground 31 via third land 25 and fourth land 27, and has the same potential as a potential of ground 31. Thereby, first land 21 and first signal line 33 are electromagnetically shielded by shielding conductor 37. A connection portion between third land 25 and shielding conductor 37 by solder or the like and a connection portion between fourth land 27 and shielding conductor 37 by solder or the like correspond to contact portions 39 to be described. In general, an entire circumference of shielding conductor 37 is not connected to ground 31, that is, shielding conductor 37 and ground 31 are connected to each other at a plurality of portions, and a plurality of gaps are formed at portions where shielding conductor 37 is not connected to ground 31.

In electronic board 13, gaps 41 are formed between an outer circumference of each of the plurality of first lands 21 and ground 31 and between an outer circumference of second land 23 and ground 31, and a connection between ground 31 and third land 25 and a connection between ground 31 and fourth land 27 are avoided. Each of the plurality of gaps 41 includes insulation gap 43 for avoiding coupling between adjacent lands or between the land and the ground, and clearance 45 of a predetermined distance. Insulation gap 43 is usually formed to be approximately 0.1 mm. Clearance 45 is set to a predetermined distance, for example, approximately 0.2 mm to 0.4 mm, clearance 45 being formed to facilitate generation of a magnetic field loop to be described. Preferably, each of the plurality of gaps 41 is formed to be 0.3 mm to 0.5 mm. On the other hand, the present disclosure is not limited thereto. For example, in a case where electronic board 13 according to the exemplary embodiment 1 is sufficiently large, each of the plurality of gaps 41 may be formed to be larger than 0.5 mm.

Further, each of a plurality of clearances 45 may not be uniform on each side of each of the plurality of first lands 21, second land 23, third land 25, and fourth land 27. As described above, each of the plurality of clearances 45 may be formed such that each of the plurality of gaps 41 including insulation gap 43 is 0.3 mm to 0.5 mm. That is, in a case where a manufacturing operator of board 19 according to the exemplary embodiment 1 disposes (connects) each land such that each of the plurality of gaps 41 including clearance 45 and insulation gap 43 is 0.3 mm to 0.5 mm, work of disposing (connecting) each land can be more efficiently performed.

Board 19 of electronic board 13 includes ground 31 that is formed on lower surface 47 on a side opposite to upper surface 29 and covers lower surface 47. On ground 31, a plurality of ground punching portions 49 are formed according to positions of the plurality of first lands 21 and second land 23. Thereby, electronic board 13 can avoid connections (contacts) between each of the plurality of first lands 21 and ground 31 and between second land 23 and ground 31 by each of the plurality of ground punching portions 49.

Figure 4A:
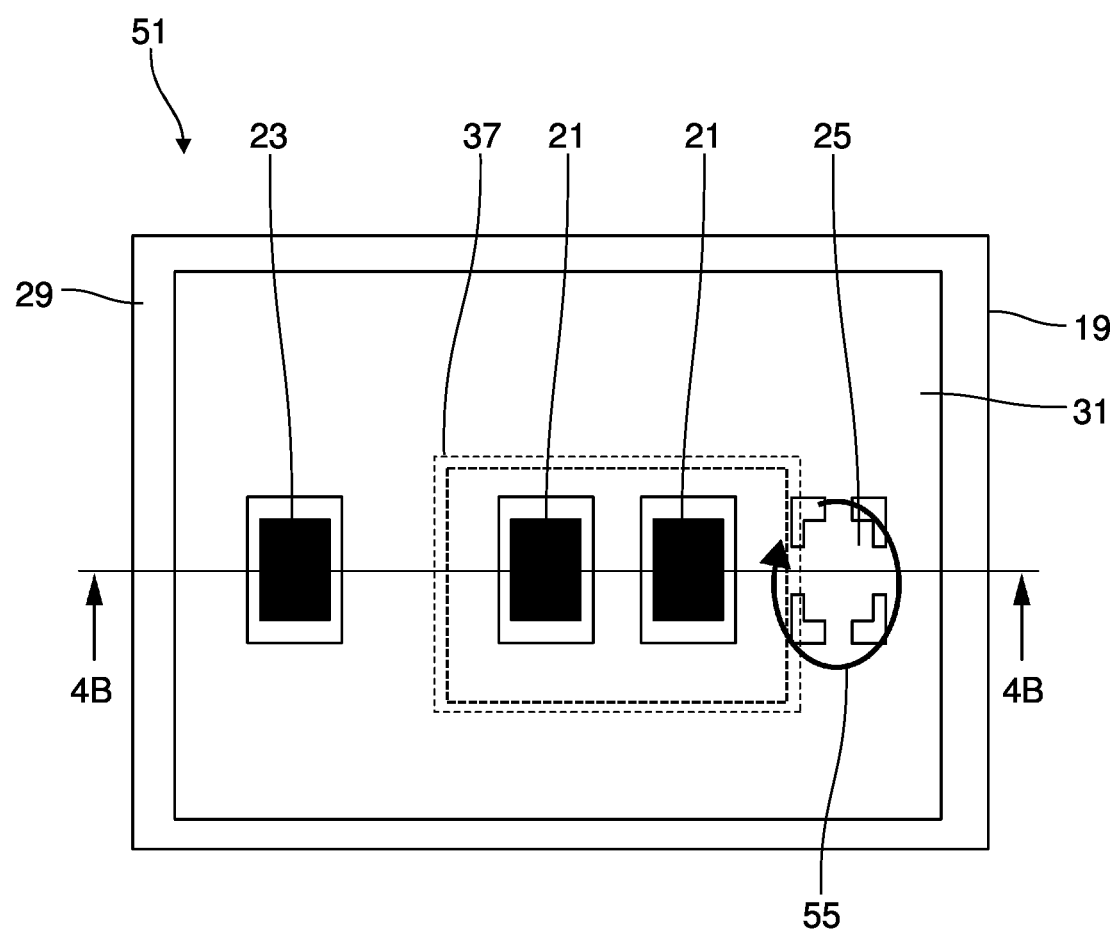
FIG. 4A is a plan view illustrating an example of a state where a magnetic field loop is generated in an electronic board according to a comparative example.
Figure 4B:
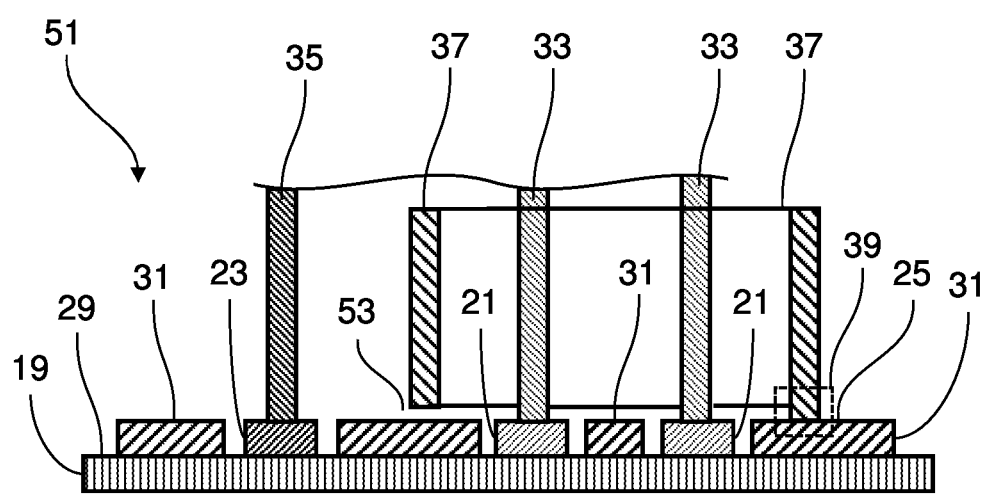
FIG. 4B is a schematic view illustrating a 4B-4B cross section in FIG. 4A.

FIG. 4A is a plan view illustrating an example of a state where a magnetic field loop is generated in electronic board 51 according to a comparative example, and FIG. 4B is a schematic view illustrating a 4B-4B cross section in FIG. 4A.

Figure 5:
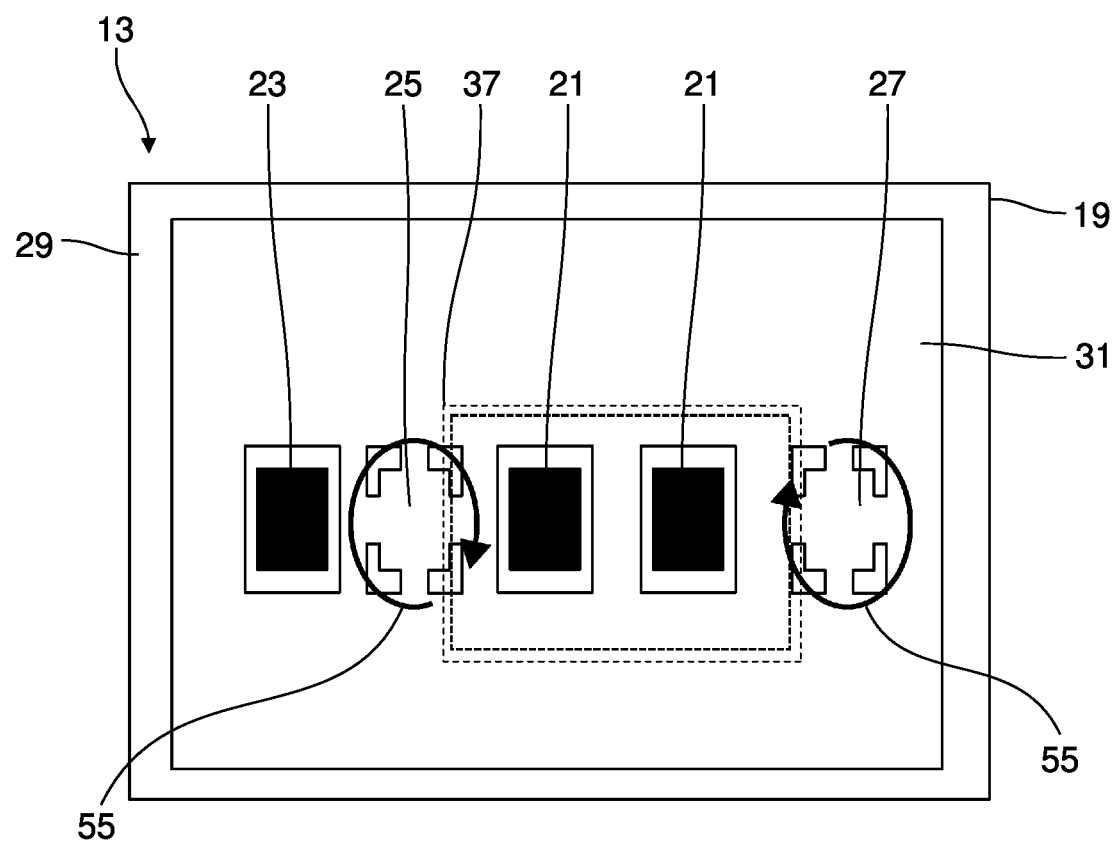
FIG. 5 is an operation explanatory diagram illustrating an example of a state where a magnetic field loop is generated in the electronic board according to the exemplary embodiment 1 in a plan view.

In electronic board 51 according to the comparative example illustrated in FIG. 4A, a video transmission pin (not illustrated) of camera 11 that outputs a high-speed signal is connected to each of the plurality of first lands 21 using, for example, a via hole penetrating electronic board 51. Further, in electronic board 51, a control signal pin (not illustrated) for transmitting a low-speed signal is connected to second land 23. Each of the plurality of first lands 21 according to the comparative example is connected to each of the plurality of first signal lines 33 on upper surface 29 of board 19. Further, second land 23 according to the comparative example illustrated in FIG. 5 is connected to second signal line 35 on upper surface 29 of board 19.

In electronic board 51 according to the comparative example, since the video signal that is generated from each of the plurality of first signal lines 33 is a high-speed signal, noise of the video signal jumps into second signal line 35. As a result, second signal line 35 functions as an antenna, and generates radiation noise. In a case where second signal line 35 functions as an antenna for receiving a radio wave from outside, the generated radiation noise jumps into the video signal of each of the plurality of first signal lines 33, and this causes an image distortion.

Further, in electronic board 51 according to the comparative example, a system to which each of the plurality of first signal lines 33 (video transmission cables) connected to each of the plurality of first lands 21 is connected is different from a system to which second signal line 35 (vehicle control cable) connected to second land 23 is connected. For this reason, each of the plurality of first lands 21 and second land 23 that have different connection destinations cannot be covered with same shielding conductor 37. Further, since the video signal is usually a signal for which communication is performed at high speed, the video signal may be influenced by noise. Thus, it is necessary to provide a shielding conductor that shields noise as described above. Since the control signal is a signal for which communication is performed at a low speed, the control signal is generally less influenced by noise. For this reason, it is not always necessary to shield the noise (that is, it is not essential).

Therefore, as in electronic board 51 according to the comparative example, in a case where the systems to which the plurality of lands on the same board are respectively connected are different from each other and one land among the plurality of lands is used for a video signal for high-speed communication, noise may be radiated from the video signal, or the video signal may be distorted due to a radio wave from outside.

On the other hand, in electronic board 51 according to the comparative example, only one contact portion 39 for conducting (connecting) shielding conductor 37 and third land 25 is provided. At this time, due to a common mode current, one magnetic field loop 55 illustrated in FIG. 4A is generated around contact portion 39 connecting ground 31 and shielding conductor 37. As a result, in electronic board 51 according to the comparative example, noise jumps into the video transmission cable (each of the plurality of first signal lines 33) due to magnetic field loop 55, and thus it is difficult to suppress an influence of the noise.

FIG. 5 is an operation explanatory diagram illustrating an example of a state where magnetic field loop 55 is generated in electronic board 13 according to the exemplary embodiment 1 in a plan view.

On electronic board 13 according to the exemplary embodiment 1, third land 25 connected to ground 31 is disposed between each of the plurality of first lands 21 and second land 23, and fourth land 27 connected to ground 31 is disposed on a side opposite to third land 25 with first lands 21 interposed therebetween. Third land 25 and fourth land 27 illustrated in FIG. 5 are disposed in lateral symmetry with first lands 21 interposed therebetween. That is, in electronic board 13 according to the exemplary embodiment 1, contact portions 39 between ground 31 and shielding conductor 37 are disposed in lateral symmetry with first lands 21 interposed therebetween. Thereby, in electronic board 13, magnetic field loops 55 that rotate in the same direction are generated around each of two contact portions 39 connecting third land 25 and shielding conductor 37 and connecting fourth land 27 and shielding conductor 37, third land 25 being disposed on the left side of the plurality of first lands 21, and fourth land 27 being disposed on the right side of the plurality of first lands 21.

The disposition of third land 25 and fourth land 27 is not limited to lateral symmetry described above. Third land 25 and fourth land 27 may be disposed so as to cancel magnetic field loops generated from each other. For example, third land 25 and fourth land 27 may be disposed in line symmetry with respect to a line orthogonal to the 3-3 cross-sectional line passing through midpoints of the plurality of first lands 21 illustrated in FIG. 2. Further, third land 25 and fourth land 27 may be disposed in line symmetry with respect to the 3-3 cross-sectional line.

Two magnetic field loops 55 are magnetic fields in directions opposite to each other at a portion where the plurality of first lands 21 are disposed (that is, in shielding conductor 37), and thus magnetic field loops 55 are canceled. That is, in electronic board 13, by generating two magnetic field loops 55, it is possible to cancel magnetic field loops 55 that are generated by a common mode current at the portion where the plurality of first lands 21 are disposed (that is, in shielding conductor 37).

Thereby, electronic board 13 according to the exemplary embodiment 1 can reduce noise that is generated from second signal line 35 and is toward each of the plurality of first signal lines 33. Further, even in a case where the circuit board cannot be covered with same shielding conductor 37 or a case where only a part of a wiring can be incompletely covered with shielding conductor 37, electronic board 13 can suppress an influence of noise. As a result, in electronic board 13, noise can be reduced, and a noise resistance performance can be improved.

Further, in electronic board 13 according to the exemplary embodiment 1, even in a case where the systems to which the plurality of lands on the same board are respectively connected are different from each other and one land among the plurality of lands is used for a video signal for high-speed communication, noise radiation from the video signal can be suppressed, and a distortion of the video signal due to a radio wave from outside can be suppressed.

FIG. 6 is an operation explanatory diagram illustrating an example of a correlation between a magnetic field attenuation amount due to each of two magnetic field loops 55 and a distance.

In electronic board 13, each of the plurality of first lands 21 is disposed so as to be located within a region of 80% of a distance D between centers of third land 25 and fourth land 27 (that is, within a region of 0.8D illustrated in FIG. 6). A position of a midpoint (0.8D)/2 of the region 0.8D matches with a position of a midpoint D/2 of the distance D between the centers.

Here, when a current is flowing through a wiring having a finite length, a magnetic field strength H at a point P separated from the wiring by a distance R is $H=(\cos\theta_1+\cos\theta_2)/4\pi R$, which is inversely proportional to the distance R. Therefore, the magnetic field strength H becomes maximum at a midpoint D/2 of first lands 21, and is decreased as a position is separated from the center position toward third land 25 or fourth land 27.

Two magnetic field loops 55 (refer to FIG. 5) generated around each of third land 25 and fourth land 27 have the same magnetic field strength at the center position of first lands 21, and correspond to magnetic fields in directions opposite to each other. Thus, two magnetic field loops 55 are canceled. As illustrated in FIG. 6, in the magnetic field strength H of each of third land 25 and fourth land 27, at the midpoint D/2 of the distance D between the centers, both magnetic field loops 55 have the same magnetic field strength in directions opposite to each other.

In electronic board 13, each of the plurality of first lands 21 is disposed so as to be located within a region of 80% of a distance D between centers of third land 25 and fourth land 27 (that is, within a region of 0.8D illustrated in FIG. 6). Thereby, effectiveness of a noise reduction effect is ensured. That is, each of the plurality of first lands 21 is disposed so as to be located within a region of 0.8D illustrated in FIG. 6, and thus electronic board 13 is configured to ensure effectiveness of a noise reduction effect due to each of two magnetic field loops 55.

As described above, electronic board 13 according to the exemplary embodiment 1 includes: board 19 including ground 31; first land 21 formed on upper surface 29 of board 19 and connected to first signal line 33; second land 23 formed on upper surface 29 and connected to second signal line 35; third land 25 disposed on upper surface 29 between first land 21 and second land 23 and connected to ground 31; and fourth land 27 disposed on upper surface 29 on a side opposite to third land 25 and connected to ground 31, first land 21 being interposed between third land 25 and fourth land 27.

Thereby, in electronic board 13 according to the exemplary embodiment 1, board 19 includes ground 31. Ground 31 is provided, for example, so as to cover upper surface 29 of board 19. On upper surface 29 of board 19, four types of lands are disposed side by side in a row. The four types of lands are disposed in order of second land 23, third land 25, first land 21, and fourth land 27 from one end side of board 19 to the other end side of board 19. In the exemplary embodiment 1, two first lands 21 are provided. Thus, five lands are arranged.

First signal line 33 which is, for example, a video transmission cable is connected to first land 21 among the lands. Second signal line 35 which is, for example, a vehicle control cable is connected to second land 23.

First land 21 and second land 23 are insulated from ground 31. By separating ground 31 covering upper surface 29 of board 19 from the outer circumference of the land at a position of each land, ground 31 and the land are insulated from each other. At this time, gap 41 formed between the circumference of the land and ground 31 includes insulation gap 43.

On the other hand, third land 25 and fourth land 27 disposed on both sides with two first signal lines 33 interposed therebetween are connected to ground 31. By remaining a state where a part of the outer circumference of each land is connected to ground 31, each land and ground 31 are connected to each other.

Therefore, in electronic board 13 according to the exemplary embodiment 1, even in a case where the systems to which the plurality of lands on the same board are respectively connected are different from each other and one land among the plurality of lands is used for a video signal for high-speed communication, noise radiation from the video signal can be suppressed, and a distortion of the video signal due to a radio wave from outside can be suppressed.

Further, in electronic board 13 according to the exemplary embodiment 1, the first land is disposed within a region of 80% of the distance between the centers of the third land and the fourth land. Thereby, electronic board 13 according to the exemplary embodiment 1 is configured to ensure effectiveness of a noise reduction effect due to each of two magnetic field loops 55.

Further, in electronic board 13 according to the exemplary embodiment 1, first land 21 and second land 23 are formed with gap 41 between the outer circumference of each land and ground 31. Gap 41 includes insulation gap 43 and clearance 45. Insulation gap 43 is formed to prevent a short circuit between the land and ground 31, and is usually formed to be approximately 0.1 mm. Clearance 45 is formed separately from insulation gap 43 to facilitate generation of magnetic field loop 55, and is set to approximately 0.2 mm to 0.4 mm. That is, in electronic board 13, gap 41 of approximately 0.3 mm to 0.5 mm is set between the outer circumferences of first land 21 and second land 23 and ground 31. Thereby, in electronic board 13, magnetic field loop 55 is likely to be generated (in other words, magnetic field loop 55 is unlikely to be coupled to ground 31), and thus a noise reduction effect can be easily obtained. Needless to say, insulation gap 43 and clearance 45 are not limited to the numerical values.

In electronic board 13 according to the exemplary embodiment 1, board 19 includes ground 31 that is formed on lower surface 47 on a side opposite to upper surface 29 and covers lower surface 47. Ground 31 on lower surface 47 is removed at positions corresponding to first land 21 and second land 23. Thereby, in electronic board 13, magnetic field loop 55 is unlikely to be coupled to ground 31 on lower surface 47 of board 19. As a result, magnetic field loop 55 is likely to be generated, and thus a noise reduction effect is more easily obtained.

Further, board 19 having a thin thinness is formed. In board 19 having a thin thinness, for example, second signal line 35 connected to second land 23 and ground 31 on lower surface 47 provided immediately below second signal line 35 are coupled to each other, and as a result, a phenomenon in which noise is spread occurs. In electronic board 13, ground 31 on lower surface 47 is removed at positions corresponding to first land 21 and second land 23, and thus it is possible to suppress spreading of noise due to ground 31 provided on lower surface 47.

Further, in electronic board 13 according to the exemplary embodiment 1, first land 21 and second land 23 are provided with gap 41 between the outer circumference of each land and ground 31. Gap 41 includes insulation gap 43 for avoiding coupling and clearance 45 of a predetermined distance. Insulation gap 43 is usually formed to be approximately 0.1 mm. Clearance 45 is set to a predetermined distance, for example, approximately 0.2 mm to 0.4 mm, clearance 45 being formed to facilitate generation of magnetic field loop 55. Clearance 45 may be formed to have a predetermined distance, and does not need to be formed to be uniform. Thereby, in electronic board 13, processing accuracy in formation of the land can be relaxed.

In electronic board 13, at least one of first land 21, second land 23, third land 25, and fourth land 27 corresponds to a plurality of lands.

Further, in electronic board 13 according to the exemplary embodiment 1, one of first land 21, second land 23, third land 25, and fourth land 27 corresponds to a plurality of lands. For example, in a case where two first lands 21 to which first signal lines 33 as video transmission cables are connected are provided, balanced transmission using two video signals of which phases are different by 180° can be performed. Thereby, in a case where balanced transmission is performed, in electronic board 13, radiation can be reduced and noise from outside is unlikely to be received.

In electronic board 13, in a case where a plurality of third lands 25 and a plurality of fourth lands 27 are disposed, third lands 25 and fourth lands 27 are disposed side by side in a direction intersecting with a line passing through one third land 25 and one fourth land 27.

Further, in electronic board 13 according to the exemplary embodiment 1, a plurality of third lands 25 and a plurality of fourth lands 27 are disposed. In this case, the plurality of third lands 25 and the plurality of fourth lands 27 are disposed side by side in a direction intersecting with a line passing through one third land 25 and one fourth land 27. That is, the plurality of third lands 25 and the plurality of fourth lands 27 are disposed so as not to be disposed in a straight line. For example, in a case where two third lands 25 and two fourth lands 27 are disposed, third lands 25 are disposed at each of a pair of adjacent corners of a quadrangle, and fourth lands 27 are disposed at each of the other pair of adjacent corners of the quadrangle. Thereby, in electronic board 13, compared with a case where one third land 25 and one fourth land 27 are provided, a canceling effect of the magnetic field loops can be improved, and thus a noise reduction effect can be further improved.

Further, in electronic board 13 according to the exemplary embodiment 1, third land 25 is disposed between first land 21 and second land 23. Thereby, in a case where third land 25 is formed in an area equal to or smaller than an area of fourth land 27, third land 25 is unlikely to interfere with other elements or other lands (for example, first land 21 or second land 23).

As described above, various exemplary embodiments have been described with reference to the drawings. On the other hand, it goes without saying that the present disclosure is not limited to the examples. It is clear that those skilled in the related art can introduce various change examples, modification examples, substitution examples, addition examples, deletion examples, and equalization examples within the scope of the claims. It is also understood that the examples fall within the technical scope of the present disclosure. Further, each component in the various exemplary embodiments may be freely combined without departing from the spirit of the inventions.

INDUSTRIAL APPLICABILITY

The present disclosure is useful as an electronic board capable of suppressing an influence of noise.

REFERENCE MARKS IN THE DRAWINGS

13: electronic board
19: board
21: first land
23: second land
25: third land
27: fourth land
29: upper surface
31: ground
33: first signal line
35: second signal line
41: gap
43: insulation gap
45: clearance
47: lower surface
49: ground punching portion
D: distance between centers

The invention claimed is:

1. An electronic board, comprising:
    a board including an upper surface ground on an upper surface;
    at least one first land formed on the upper surface and connected to a first signal line;
    at least one second land formed on the upper surface and connected to a second signal line;
    at least one third land disposed on the upper surface between the at least one first land and the at least one second land and connected to the upper surface ground;
    at least one fourth land disposed on the upper surface on a side opposite to the at least one third land and connected to the upper surface ground, the at least one first land being interposed between the at least one third land and the at least one fourth land; and
    a shielding conductor connected to the upper surface ground via the at least one third land and the at least one fourth land, the shielding conductor surrounding and covering the at least one first land and the first signal line to electromagnetically shield the at least one first land and the first signal line.

2. The electronic board according to claim 1, wherein the at least one first land is disposed within a region of 80% of a distance between a center of the at least one third land and a center of the at least one fourth land.

3. The electronic board according to claim 1, wherein a gap provided between an outer circumference of each of the at least one first land and the at least one second land and the upper surface ground includes a clearance of a predetermined distance.

4. The electronic board according to claim 1, wherein the board includes a lower surface ground that is provided on a lower surface opposite to the upper surface and covers the lower surface, and
    the lower surface ground does not exist at positions corresponding to the at least one first land and the at least one second land.

5. The electronic board according to claim 3, wherein the clearance is not uniform.

6. The electronic board according to claim 1, wherein at least one of the at least one first land, the at least one second land, the at least one third land, and the at least one fourth land corresponds to a plurality of lands.

7. The electronic board according to claim 6, wherein a plurality of third lands or a plurality of fourth lands are disposed side by side in a direction intersecting with a line passing through one of the plurality of third lands and one of the plurality of fourth lands.

8. The electronic board according to claim 1, wherein an area of the at least one third land is equal to or smaller than an area of the at least one fourth land.

* * * * *